(12) United States Patent
Deeter et al.

(10) Patent No.: US 6,646,340 B2
(45) Date of Patent: *Nov. 11, 2003

(54) THERMALLY COUPLING ELECTRICALLY DECOUPLING COOLING DEVICE FOR INTEGRATED CIRCUITS

(75) Inventors: Timothy L. Deeter, Portland, OR (US); Thomas Marieb, Portland, OR (US); Daniel Murray, Portland, OR (US); Daniel Pantuso, Portland, OR (US); Sarangapani Sista, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/339,134

(22) Filed: Jan. 8, 2003

(65) Prior Publication Data

US 2003/0151131 A1 Aug. 14, 2003

Related U.S. Application Data

(62) Division of application No. 10/076,680, filed on Feb. 14, 2002, now Pat. No. 6,525,419.

(51) Int. Cl.[7] .............................................. H01L 23/34
(52) U.S. Cl. ....................... 257/712; 257/625; 257/675; 438/122
(58) Field of Search ..................... 257/81, 99, 177–181, 257/584, 625, 675, 688, 689, 705–707, 712–722, 796, 467, 468, 573; 438/22, 24, 117, 122–127; 333/227, 229; 361/700, 704, 687, 690, 695, 688, 718

(56) References Cited

U.S. PATENT DOCUMENTS

6,034,408 A * 3/2000 Ghoshal ...................... 257/467
6,222,254 B1 * 4/2001 Liang et al. ................ 257/622
6,437,437 B1 * 8/2002 Zuo et al. ................... 257/710
6,525,419 B1 * 2/2003 Deeter et al. ............... 257/712

OTHER PUBLICATIONS

Analysis and Optimization of Thermal Issues in High Performance VSLI. Kaustav Banerjee, Massoud Pedram and Amir H. Ajami. International Symposioum on Physical Design (ISPD) '01, Apr. 1–4, 2001, Sonoma, CA ISA. pp. 230–237.
The Effect of Interconnect Scaling and Low–k Dielectric on the Thermal Characteristics of IC Metal. Kaustav Banerjee, Ajith Amerasekera, Girish Dixit and Chenming Hu. 1996 IEEE. pp. 3.3.1–3.3.4.
Effect of Via Seperation and Low–k Dielectric Materials on the Thermal Characteristics of Cu Interconnects. Ting–Yen Chiang, Kaustav Banerjee, Krishna C. Saraswat. © 2000 IEEE. pp. 11.4.1–11.4.4.
On Thermal Effects in Deep Sub–Micron VSLI Interconnects, Kaustav Banerjee, Amit Mehrotra, Alberto Sangiovanni–Vincentelli, Chenming Hu. DAC 99, New Orleans, Louisianna © 1999. pp. 885–891.

* cited by examiner

Primary Examiner—David Nelms
Assistant Examiner—Long Tran
(74) Attorney, Agent, or Firm—Blakely, Sokoloff, Taylor & Zafman LLP (57) ABSTRACT

A thermally coupling electrically decoupling cooling device is described. The cooling device may be thermally disposed between a self-heating electrically conductive line and a semiconductor substrate to cool the line by transferring heat from the line to the substrate while blocking flow of current from the line to the substrate. The cooling device may contain a thermally conductive structure, such as a stack of vias and lines, to conduct heat away from the electrically conductive line, and a current blocking structure, such as a reverse biased diode or a capacitor, to block current flow into the substrate. Specific current blocking structures include a reverse biased diode containing an n-doped region and a p-doped region disposed between the thermally conductive structure and the substrate, and a capacitor containing a dielectric layer disposed between the thermally conductive structure and the semiconductor substrate.

50 Claims, 9 Drawing Sheets

THERMALLY COUPLING ELECTRICALLY DECOUPLING COOLING DEVICE FOR INTEGRATED CIRCUITS

The present application is a divisional application of U.S. patent application Ser. No. 10/076,680, filed Feb. 14, 2002, now U.S. Pat. No. 6,525,419 entitled "Thermally Coupling Electrically Decoupling Cooling Device For Integrated Circuits", currently pending The U.S. patent application Ser. No. 10/076,680 is hereby entirely incorporated by reference.

BACKGROUND OF THE INVENTION

1. Field of the Invention

The invention relates generally to cooling of integrated circuits. More particularly, the invention relates to a thermally coupling electrically decoupling cooling -device to cool a self-heating electrically conductive line by transferring heat from the line to a semiconductor substrate while blocking flow of current from the line to the substrate, and to an integrated circuit containing the cooling device.

2. Background Information

Many integrated circuits include multi-layer electrical interconnect structures to provide power and electrical signals to logic elements such as transistors located on a semiconductor substrate. As will be explained further below, these interconnect structures may become heated during operation, due to typically small electrical resistances, and the heat so generated can lead to electromigration that degrades the performance and reliability of the integrated circuits.

Figure 1:
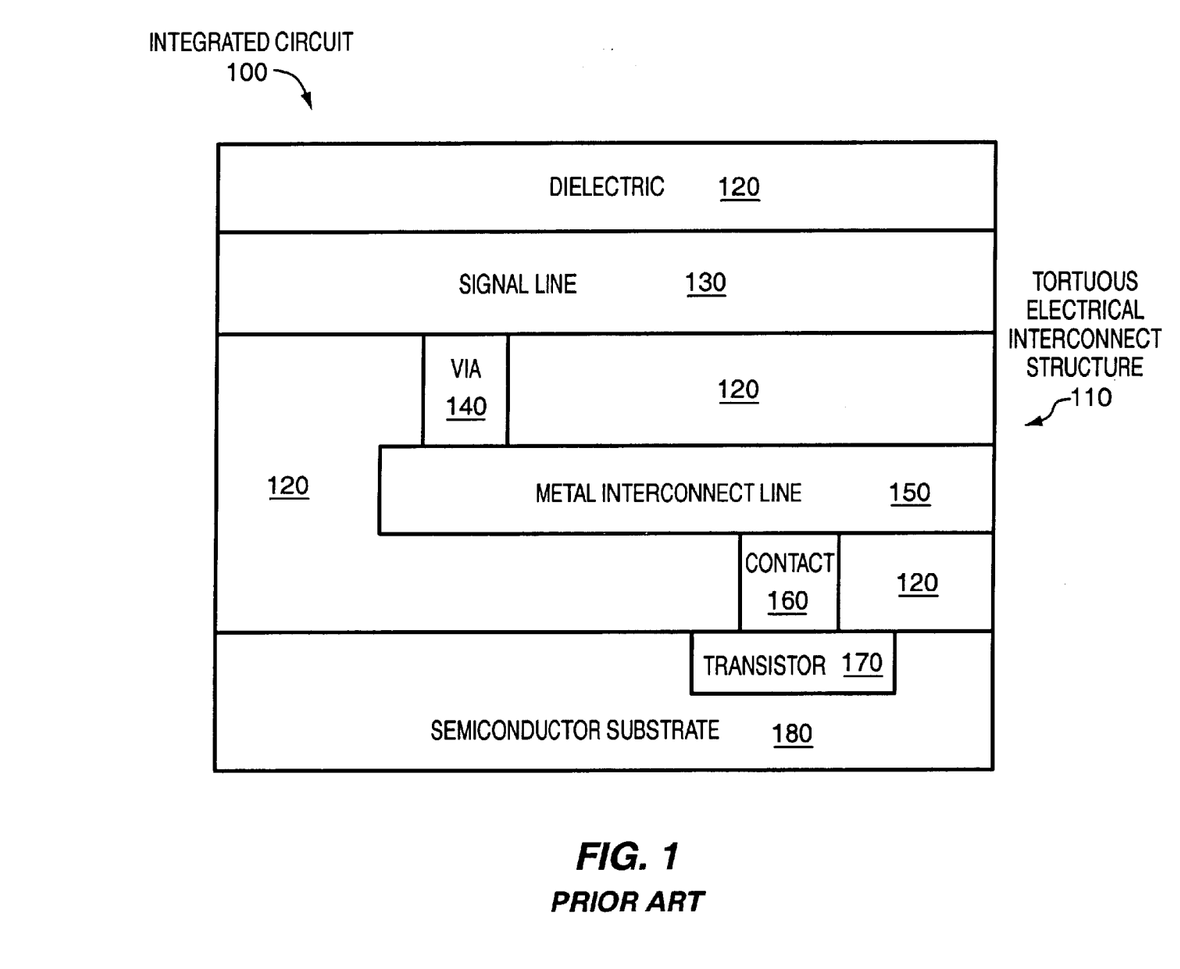
FIG. 1 shows an integrated circuit having a two-metal layer electrical interconnect structure that contains a self-heating signal line that converts a portion of an electrical current transmitted across the line into heat.

FIG. 1 illustrates a cross section of an integrated circuit 100 having a two-metal layer electrical interconnect structure that contains a self-heating signal line 130 that, as a result of operation, converts a portion of an electrical current transmitted across the line into heat. The integrated circuit contains a dielectric material 120, a tortuous electrical interconnect structure 110 embedded in the dielectric material, and a semiconductor substrate 180 containing a transistor 170. The interconnect structure contains the signal line 130, via 140, a metal interconnect line 150, and a contact 160. The signal line resides within a single layer and receives electrical current representing a signal for the transistor. The via is in electrical contact with the signal line to receive the signal and provide it to the metal interconnect line located in a sublayer. Similarly, the contact is in electrical contact with the metal interconnect line to receive the signal and provide it to the transistor.

The signal line may generate heat as a result of the electrical current and signals transmitted over it. Typically this is a result of small but non-zero electrical resistances within the signal line that convert a portion of the electrical current energy into heat. The amount of heat generated by the signal line may be related to the square of the current carried by the line multiplied by the electrical resistance of the signal line material. This form of resistive self-heating is well known. Since the signal line is surrounded by dielectric material, which typically has a low thermal conductivity, the heat is unable to dissipate and the temperature of the signal line increases. Such an increase in temperature may promote electromigration that may degrade the performance and reliability of the interconnect lines and the integrated circuit.

Electromigration is the unintended movement of metal atoms of the signal line as a result of frictional forces imposed by electrical current and may lead to poor reliability and integrated circuit failure. Such movement may cause troughs to form at a start of the signal line where material is removed and hills to form at an end of an interconnect line where the moved material accumulates. This can weaken the line, rupture the line, and cause the integrated circuit to fail. Additionally, metal atoms may diffuse into the dielectric material creating unintended non-via electrically conductive pathways between layers that can electrically short. Accordingly, increases in signal line temperature may cause increased electromigration and decreased integrated circuit performance and reliability.

One way to reduce electromigration is to reduce current and current density in the signal line so that self-heating decreases. However, this poses significant limitations on integrated circuit performance. For example, this may cause the current levels to decrease to a point where the transistor switches slowly and performance of the integrated circuits compromised.

Recently, the significance of electromigration has increased due to the technological scale down and shrinkage of integrated circuits and interconnect structures. Shrinking a signal line reduces the cross sectional area, which causes higher current densities and greater electrical resistance per unit length. This higher electrical resistance may cause more heat to be generated. Additionally, reducing the cross sectional area decreases the amount of heat transfer area in contact with the surrounding dielectric material that is available for heat dissipation. This problem becomes even worse when low dielectric constant materials having a dielectric constant lower then silicon dioxide are used, since these materials often have even lower thermal conductivities that prevent heat dissipation.

BRIEF DESCRIPTION OF THE SEVERAL VIEWS OF THE DRAWINGS

The novel features believed characteristic of the invention are set forth in the appended claims. The present invention is illustrated by way of example, and not by way of limitation, in the figures of the accompanying drawings and in which like reference numerals refer to similar elements. The invention itself, however, as well as a preferred mode of use, will best be understood by reference to the following detailed description of an illustrative embodiment when read in conjunction with the accompanying drawings:

DETAILED DESCRIPTION OF THE INVENTION

In the following description, for the purpose of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Figure 2:
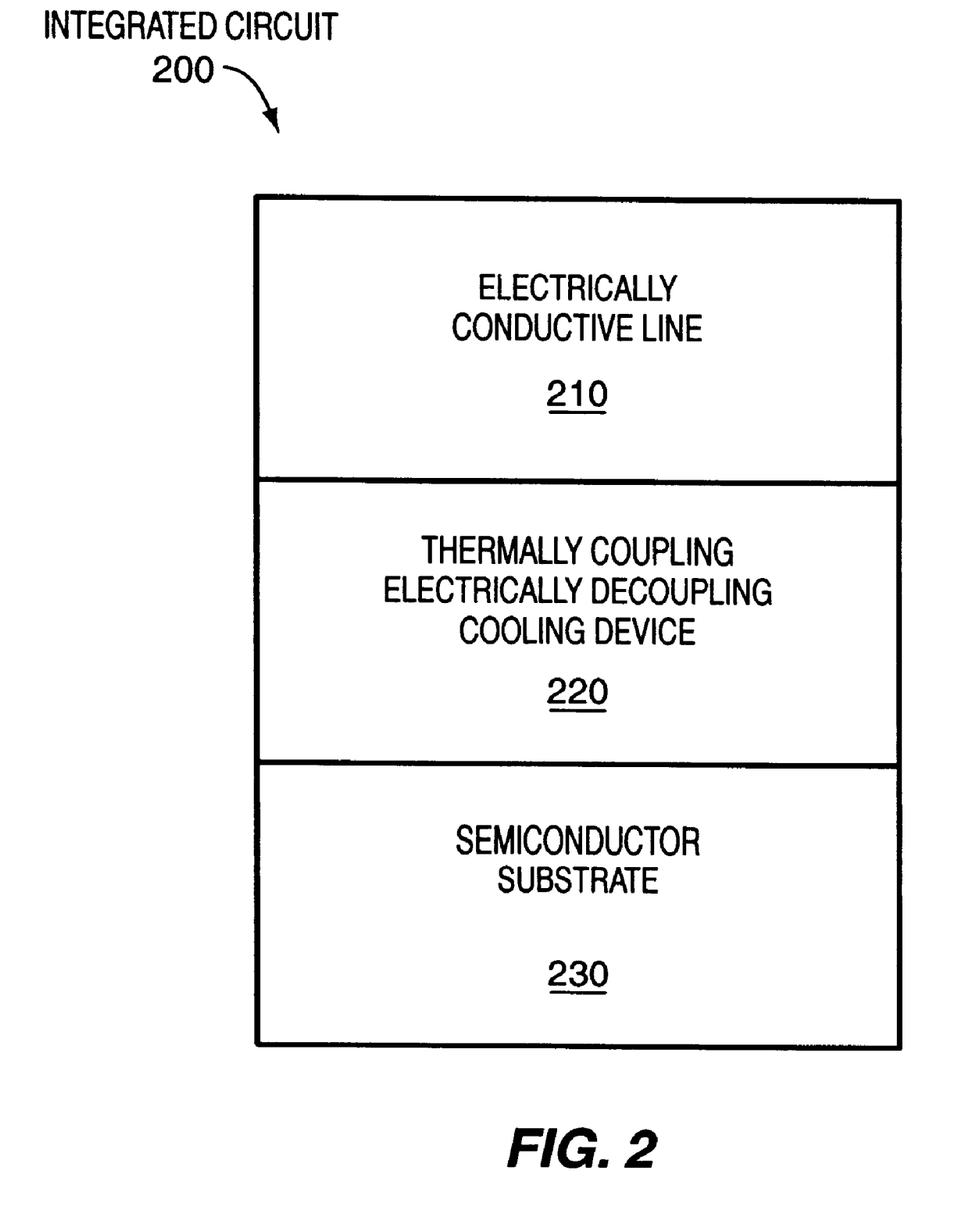
FIG. 2 shows an integrated circuit containing a semiconductor substrate, a self-heating electrically conductive line, and a thermally coupling electrically decoupling cooling device to cool the line by transferring heat to the semiconductor substrate while blocking flow of current from the line to the substrate, according to one embodiment of the present invention.

FIG. 2 illustrates an integrated circuit 200 containing a semiconductor substrate 230, a self-heating electrically conductive line 210, and a thermally coupling electrically decoupling cooling device 220 to cool the line by transferring heat to the semiconductor substrate while blocking the flow of current from the line to the substrate, according to one embodiment of the present invention. Advantageously, the cooling device may conduct heat away from the line, thereby cooling the line and improving the performance and reliability of the line and the integrated circuit.

The integrated circuit 200 is to be interpreted broadly. The terms integrated circuit, chip, monolithic device, semiconductor device, and microelectronic device, are often used interchangeably in this field. Embodiments of the present invention are applicable to all the above as they are generally understood in the field. The integrated circuit of one embodiment is a microprocessor, such as Intel® Pentium® 4 Processor, available from Intel Corporation of Santa Clara, Calif.

The electrically conductive line 210 is an electrically conductive signal path or medium to carry an electrical signal associated with the integrated circuit 200. The conductive line will be used to include interconnects, traces, wires, metal lines, and metal as they are generally understood in the field. The related terms interconnect, trace, wire, metal line, and metal are often used interchangeably and appear in order from more specific to more general. According to a first embodiment of the present invention, the line comprises an electrically conductive power line coupled to a positive power supply node to receive a nearly continuous supply of electrical current and voltage constituting power for distribution to the integrated circuit. According to a second embodiment of the present invention, the line comprises an electrically conductive signal line coupled to a signal node to receive typically discrete, high-frequency, high-slope electrical signals for distribution to integrated circuit active elements.

The electrically conductive line 210 comprises an electrically conductive material sufficient to carry the electrical signals. The conductive material is not a limitation of the present invention, although various materials that are contemplated will be discussed briefly. Often the conductive material may be a metal such as but not limited to aluminum (Al), copper (Cu), an alloy, an alloy of copper, an alloy of copper and aluminum, an alloy of copper and magnesium (Mg), an alloy of copper and niobium (Nb), an alloy of copper and aluminum and another material, an alloy of copper and aluminum and silicon (Si), and other materials (e.g., material comprising titanium (Ti), tantalum (Ta), tantalum nitride (TaN), tungsten (W), nickel (Ni), molybdenum (Mo), or a refractory metal silicide). Often the metal may include copper as the primary material, since copper has a lower electrical resistance than many other conductive materials and allows smaller width lines. The line may also be a conductive semiconductor material, such as doped semiconductor, doped polysilicon, or doped single-crystal silicon (also known as diffusion which includes both thermal diffusion doping and ion implantation doping).

The conductive line is self-heating in that the conductive material has a typically small but non-negligible electrical resistance that causes a portion of the electrical signal passed over the line to be converted into thermal heat. That is, the line essentially generates heat as electrical current is transmitted to active devices of the semiconductor substrate. The heat generated may cause the temperature of the line to increase by between about 5° C. and about 20° C. This increase in temperature may make the line hotter than the cooling device and hotter than the semiconductor substrate.

The cooling device 220 is functionally disposed between the electrically conductive line 210 and the semiconductor substrate 230 to transfer heat from the line to the semiconductor substrate while effectively suppressing flow of electrical current from the line to the semiconductor substrate. The cooling device may transfer heat due to thermal conduction driven by a natural temperature differential that develops due to the self heating and that is characterized by a higher temperature in the line than in the cooling device and a higher temperature in the cooling device, after transfer of some heat, than in the semiconductor substrate. Advantageously, in this way the cooling device may remove heat from the line to the semiconductor substrate without adversely affecting the electrical operation of the semiconductor substrate. This may improve reliability by decreasing electromigration and improve performance by allowing effective currents to be carried across the line.

The semiconductor substrate 230 is thermally coupled with the cooling device to receive heat from the cooling device, due to a lower temperature in the semiconductor substrate than in the cooling device, and is electrically decoupled from the cooling device and from the electrically conductive line so that no significant electrical current sufficient to disrupt operation of the semiconductor substrate is transmitted from the line to the semiconductor substrate through the cooling device.

The semiconductor substrate is to be interpreted broadly as any semiconductor substrate that may function as a heat sink to absorb, transmit, dissipate, or absorb, transmit, and dissipate the heat received from the cooling device. The semiconductor substrate is shown in simplified format so as not to obscure the concepts of the present invention, however those having an ordinary level of skill in the art and the benefit of the present disclosure will appreciate that the semiconductor substrate may include the electrically active elements of a microprocessor, a memory, or another form of semiconductor device for an integrated circuit. For example, the semiconductor substrate may be a silicon wafer having various semiconductor electrical components (e.g., transistors, capacitors, resistors, diodes, etc.) formed therein that are connected to power and signal distribution lines by interconnects such as vias and metal lines to form a microprocessor. Additionally, the semiconductor substrate is not limited to silicon, and may include germanium, gallium arsenide, as well as numerous other materials.

Figure 3:
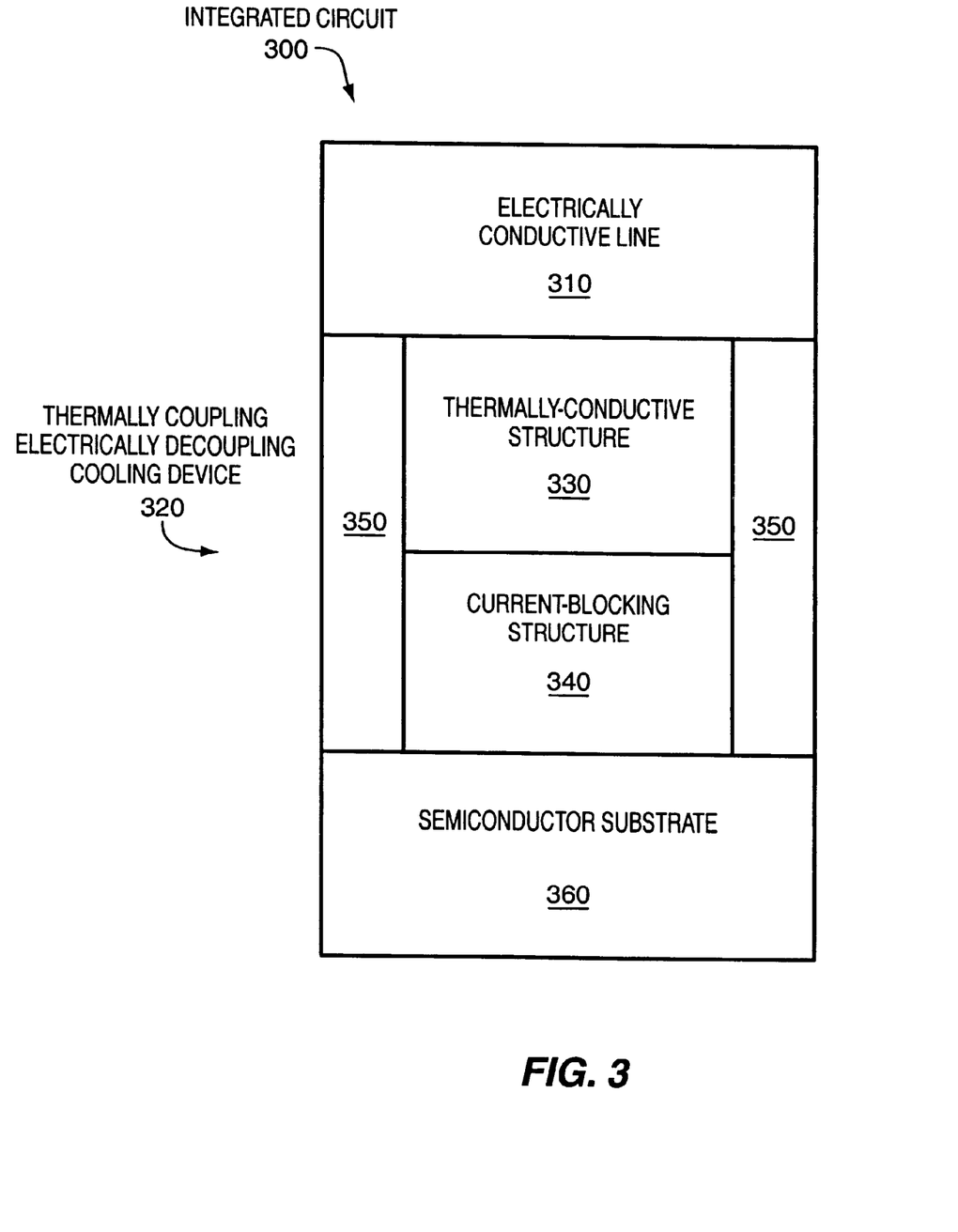
FIG. 3 shows an integrated circuit having a thermally coupling electrically decoupling cooling device that contains a thermally conductive structure and a current blocking structure, according to one embodiment of the present invention.
Figure 4:
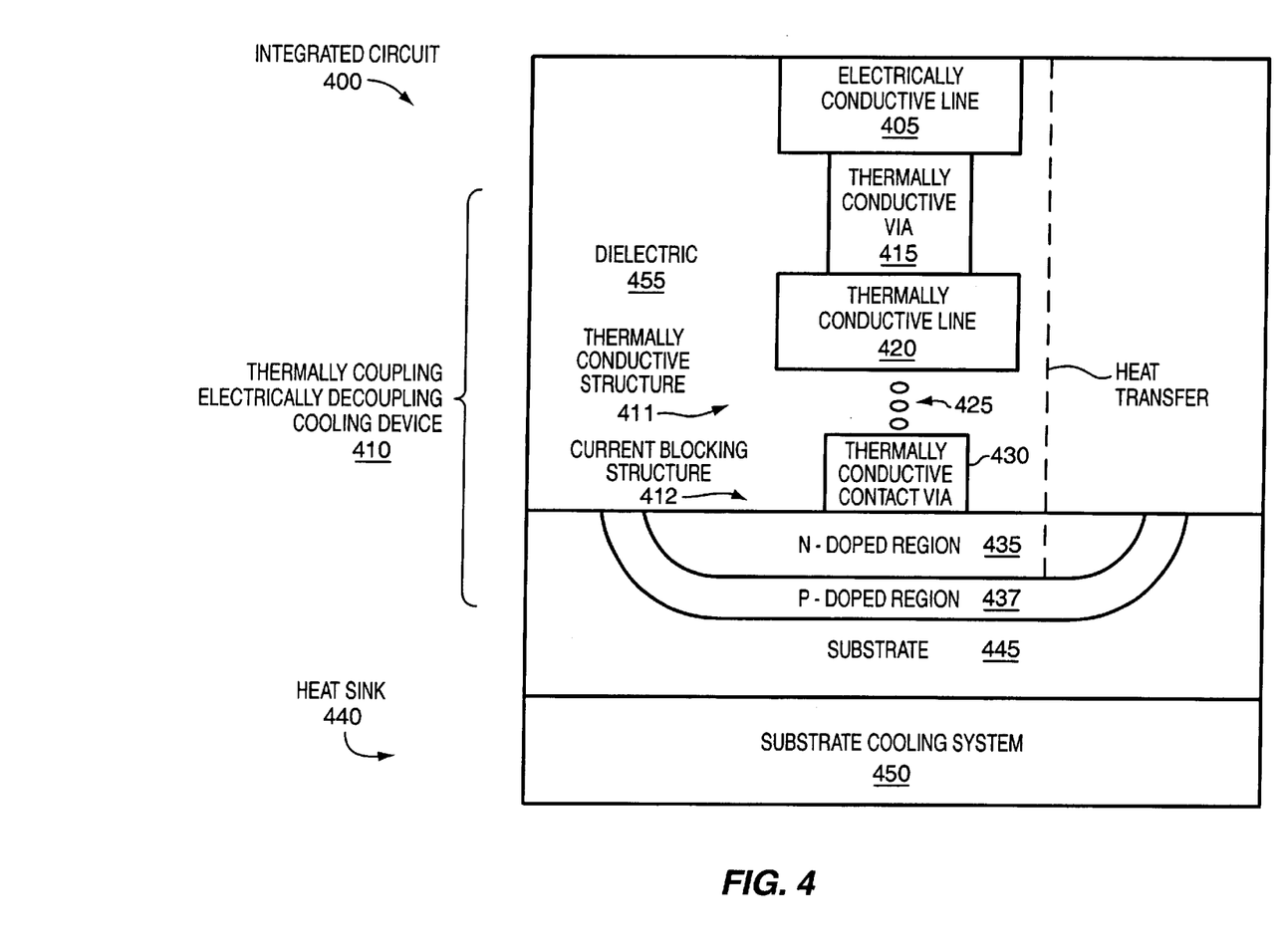
FIG. 4 shows an integrated circuit having a thermally coupling electrically decoupling cooling device that contains a thermally conductive stack structure of vias and lines, and a current blocking reverse biased diode structure containing an n-doped region within a p-doped region, according to one embodiment of the present invention.
Figure 6:
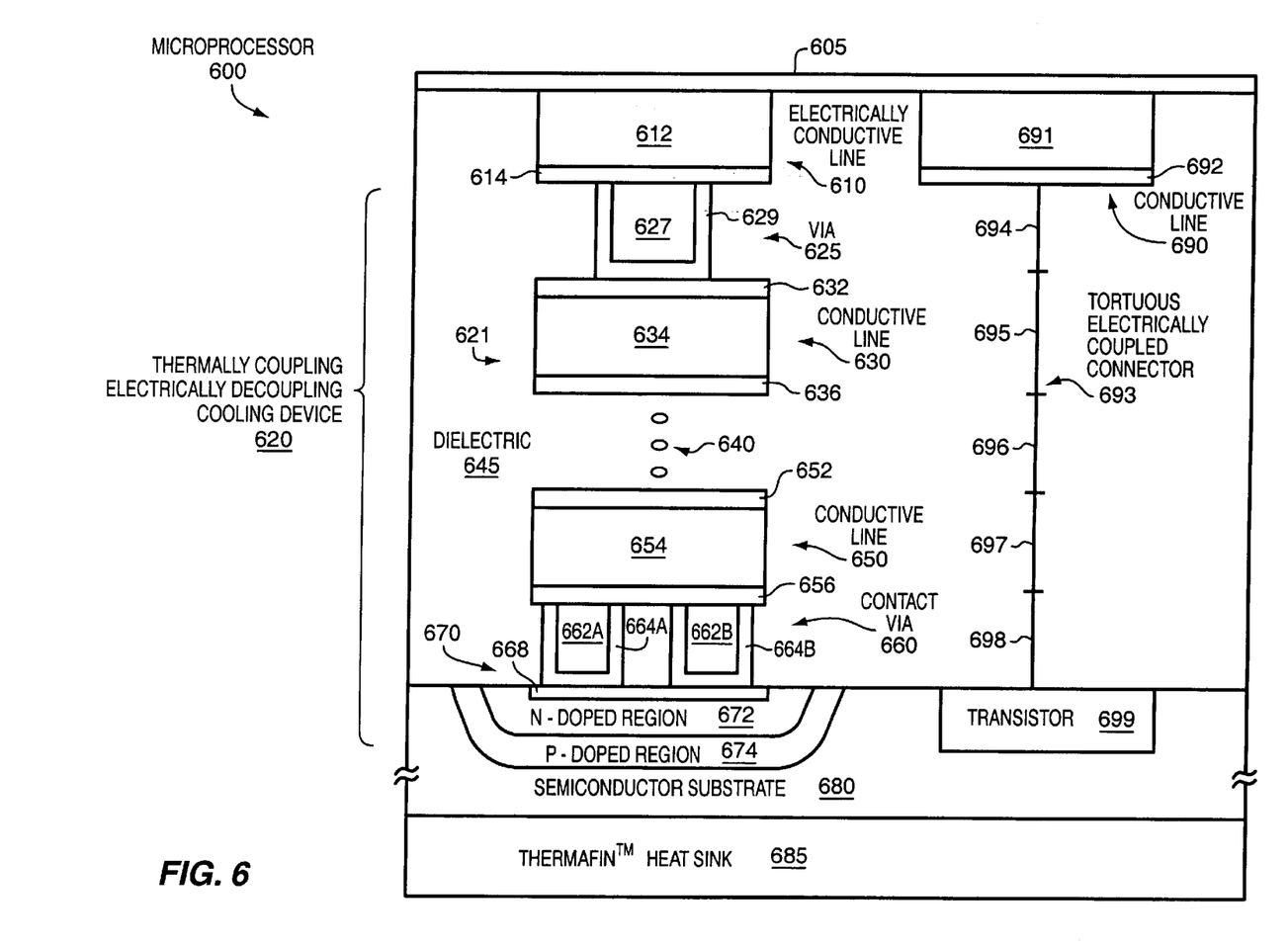
FIG. 6 shows a microprocessor integrated circuit containing a thermally coupling electrically decoupling cooling device that contains a thermally conductive stack structure of lined vias and lined conductive lines, and a current blocking reverse biased diode structure of an n-doped region within a p-doped region, according to one embodiment of the present invention.
Figure 7:
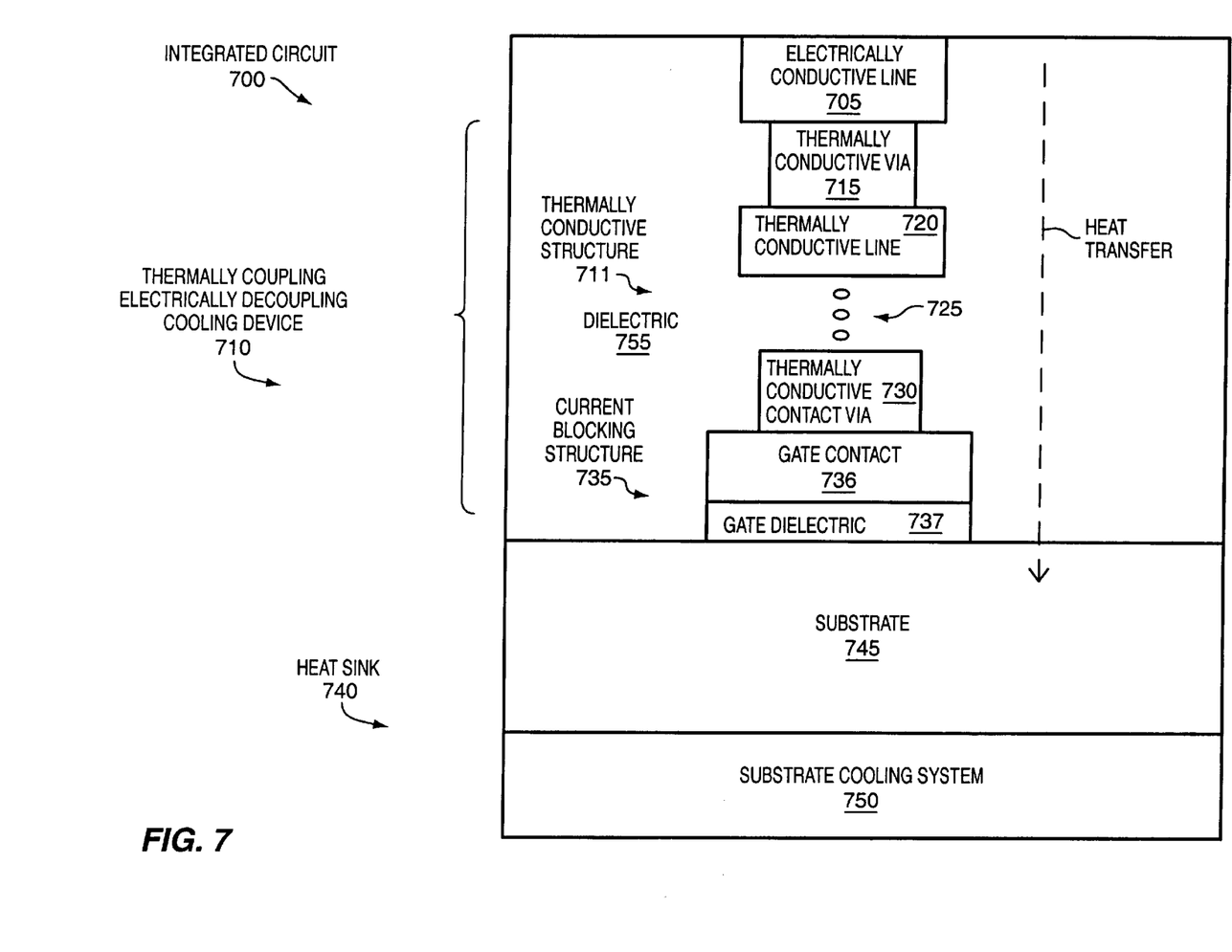
FIG. 7 shows an integrated circuit having a thermally coupling electrically decoupling cooling device that contains a thermally conductive stack structure of vias and lines, and a current blocking capacitor structure containing an electrically insulating dielectric layer such as a thin gate oxide layer, according to one embodiment of the present invention.

Different embodiments of the cooling device 220 are contemplated and will be discussed in greater detail below. In particular, FIG. 3 illustrates a first cooling device that contains a thermally conductive structure and a current blocking structure. FIGS. 4 and 6 illustrate a second and a third cooling device that contain a thermally conductive stack structure of vias and lines and a current blocking reverse biased diode structure that contains a n-doped region and a p-doped region aligned with a positive voltage drop from the n-region to the p-region. Cooling devices containing such current blocking structures may be especially useful for cooling signal lines, since the current blocking structure may cool the signal line without significantly affecting signals carried across the line. FIG. 7 illustrates a fourth cooling device that contains a thermally conductive stack structure of vias and lines and a current blocking capacitor structure formed of an electrically insulating dielectric layer disposed between the thermally conductive structure and the semiconductor substrate. Cooling devices containing such current blocking structures may be useful for cooling power lines, since the added capacitance may provide beneficial decoupling capacitance, and should not alter signals carried by the power lines.

FIG. 3 shows an integrated circuit 300 having a thermally coupling electrically decoupling cooling device 320 that contains a thermally conductive structure 330 and a current blocking structure 340, according to one embodiment of the present invention. The cooling device including the thermally conductive structure and the current blocking structure is disposed between a self-heating electrically conductive line 310 and a semiconductor substrate 360 and resides within a dielectric material 350.

The thermally conductive structure 330 is thermally coupled with the line to receive heat from the line by conduction. As current is passed through the line and the temperature of the line increases, a temperature difference develops between the relatively hot line and the thermally conductive structure. This temperature difference drives thermal conduction of heat from the line into the thermally conductive structure. A similar driving force may exist between the line and the dielectric material, although the dielectric material typically has a low thermal conductivity that does not allow an effective amount of heat to be transferred. As a result of thermal conduction into the thermally conductive structure, heat is withdrawn from the line and the maximum temperature established in the line is essentially reduced.

The current blocking structure 340 is thermally coupled with the thermally conductive structure to receive heat from the thermally conductive structure. As heat is passed from the line into the thermally conductive structure, the temperature of the thermally conductive structure begins to increase to a slightly lower temperature than that in the line. As this temperature begins to increase, a temperature difference develops between the relatively hot thermally conductive structure and the current blocking structure. This temperature difference drives conduction of heat from the thermally conductive structure into the current blocking structure. Thus, heat has been passed from the line, through the thermally conductive structure, and into the current blocking structure.

The semiconductor substrate 360 is thermally coupled with the current blocking structure to receive heat from the current blocking structure. As heat is passed from the thermally conductive structure into the current blocking structure the temperature within the current blocking structure begins to increase to a slightly lower temperature than that in the thermally conductive structure. A temperature difference develops between the relatively hot current blocking structure and the relatively cool semiconductor substrate. This temperature difference drives conduction of heat from the current blocking structure into the semiconductor substrate. Thus, heat has been passed from the line to the thermally conductive structure, from the thermally conductive structure to the current blocking structure, and from the current blocking structure to the semiconductor substrate. Advantageously, this allows the cooling device to decrease the temperature within the line.

FIG. 4 illustrates an integrated circuit 400 having a thermally coupling electrically decoupling cooling device 410 that contains a thermally conductive stack structure 411 containing vias and lines, and a current blocking reverse biased semiconductor diode structure 412 containing an n-doped region, within a p-doped region, according to one embodiment of the present invention. The cooling device conducts heat away from an electrically conductive line 405 and into a substrate 445 while at the same time blocking electrical current that is carried on the line from flowing into the substrate.

The thermally conductive structure 411 includes a stack of thermally conductive vias and thermally conductive lines that traverse multiple layers of dielectric material 455 disposed between the line 405 and the substrate 445. The dielectric may comprise an oxide of silicon (e.g. silicon dioxide) or a low-k dielectric having a dielectric constant lower than that of silicon dioxide. The structure 411 includes a first thermally conductive via 415, a first thermally conductive line 420, an optional thermally conductive structure 425, and a thermally conductive contact via 430. The via, the line, the optional structure, and the contact via may each reside in a different layer of a multi-layer interconnect structure formed in the dielectric material. The line 420 will be termed a "line" since it may occur within a layer that contains interconnect lines formed therein, although the line 420 may actually comprise a short line segment that may have dimensions down to about that of a via.

The via 415 may be any thermally conductive structure, such as a metal filled hole in the dielectric material that connects or couples the line 405 with the line 420. Similarly, the contact via may be any thermally conductive structure, such as a pair of metal filled holes in the dielectric material that connects or couples a superjacent conductive structure with the semiconductor substrate.

The via 415 has a top surface in thermal contact with the line 405 to receive heat from the line 405 by thermal conduction and a bottom surface to provide the heat. The line 420 has a top surface in thermal contact with the bottom surface of the via 415 to receive heat by thermal conduction and a bottom surface to provide the heat. The structure 425 may similarly have a top surface in thermal contact with the bottom surface of the line 420 to receive heat from the line 420 by thermal conduction and a bottom surface to provide the heat. The contact via 430 has a top surface that is thermally coupled with the bottom surface of either the line 420 or the structure 425 (when the structure is present), to receive heat by thermal conduction and has a bottom surface to provide heat to the current blocking structure 412.

The structure 425 may contain any desired number of additional vias and lines. Each additional via and line may be similar to the via 415 and the line 420, respectively, or they may be different. According to one embodiment of the present invention, the structure 425 contains an even number of additional vias and lines in alternating order in different layers starting with an additional via in contact with the line 420 at a top surface thereof and ending with an additional conductive line in contact with the contact via 430 at a bottom surface thereof. For example, according to one particular embodiment of the present invention, the thermally conductive structure 411 contains a thirteen layer stack of vias and lines including the following from top to bottom disposed between the line 405 and the current blocking structure 412: first via 415/first line 420/second via/second line/third via/third line/fourth via/fourth line/fifth via/fifth line/sixth via/sixth line/contact via 430.

The via 415, the line 420, the structure 425, and the contact via 430 typically contain thermally conductive material. Typically the material has a higher thermal conductivity than the dielectric material. For example, the material may have a higher thermal conductivity than silicon dioxide ($SiO_2$). Since it is desirable to suppress flow of electrical current between the line 405 and the substrate 445 the material need not be electrically conductive. However, to simplify fabrication of the thermally conductive structure 411, it may be desirable to use materials typically used to fabricate multi-layer interconnect structures, which are often electrically conductive metals. Specific materials that are contemplated for the via 415, the line 420, the structure 425, and the contact via 430 include a material used for the line 405, a metal, copper, aluminum, an alloy or blend, a binary alloy, an alloy of primarily copper, an alloy of copper and aluminum, an alloy of copper and magnesium, or an alloy of copper and niobium, a ternary alloy, an alloy of copper and aluminum and another material, an alloy of copper and aluminum and silicon, tungsten, titanium, tungsten coated with titanium, tantalum, tantalum nitride, nickel, molybdenum, and a refractory metal silicide.

The current blocking structure 412 includes an n-doped region 435 embedded in the near-surface region of a p-doped region 437 of the semiconductor substrate 445. The structure 412 sufficiently blocks flow of current from the line 405 to the semiconductor substrate while allowing thermal conduction of an effective amount of heat to the substrate. The doped regions may be regions of semiconductor material that contain doping material. For example, the doped regions may be doped silicon, doped polysilicon, doped single-crystal silicon, or diffusion which contain effective levels of atoms formed in the semiconductor material by thermal diffusion doping, ion implantation doping, or by other techniques.

Figure 5:
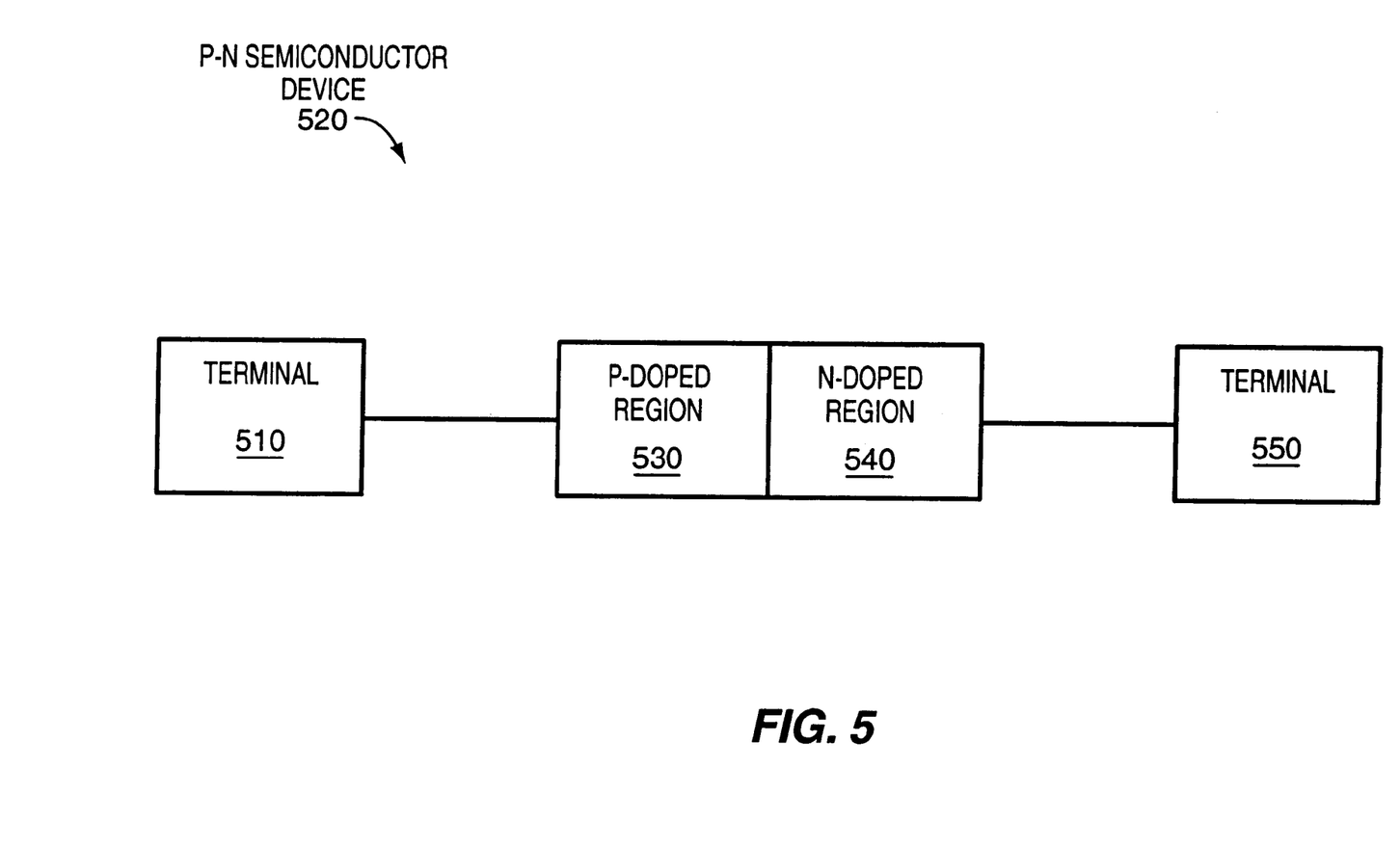
FIG. 5 shows a semiconductor device containing a p-doped region and an n-doped region, the semiconductor device operable to transmit electrical current as a semiconductor diode when a positive voltage is applied from the p-doped region to the n-doped region and operable to block electrical current when a positive voltage drop is applied from the n-doped region to the p-doped region.

Before describing the current blocking structure in further detail, a brief discussion of p-n semiconductor devices will be provided with reference to FIG. 5 to illustrate concepts that will be useful for understanding the operation of the current blocking structure 412.

FIG. 5 illustrates a semiconductor device 520 containing a p-doped region 530 and an n-doped region 540, the semiconductor device is operable to transmit electrical current as a semiconductor diode when positive voltage is applied from the p-region to the n-region and is operable to block electrical current when positive voltage is applied from the n-region to the p-region. The semiconductor device represents an example of a two-terminal semiconductor device, which as a diode has a low resistance to electric current in one direction, and which as a reverse biased diode has a high resistance to electrical current in the opposite direction.

The semiconductor device 520 is disposed between a first terminal 510 and a second terminal 550 that provide a prescribed voltage drop across the device. The device contains on a left hand side a p-doped region adjacent to an n-doped region on a right hand side. Depending upon the voltage drop applied across the device it may operate alternatively as a p-n junction semiconductor diode or a p-n junction reverse biased semiconductor diode. As will be explained conceptually below, the device conducts electricity when a positive voltage is applied from the p-doped region to the n-doped region, but does not conduct electricity under the reverse configuration wherein a positive voltage is applied from the n-region to the p-region.

Consider first what happens when a positive voltage drop as applied from the left-hand side (i.e., from the p-doped region) to the right-hand side (i.e., to the n-doped region). Since electrons move in the opposite direction of current, electrons will move to the left in the n-doped region. Similarly, holes will move to the right in the p-doped region. Proximate the interface between the p-region and the n-region electrons and holes will combine and disappear. Essentially this provides a flow of holes moving to the right in the p-region and a flow of electrons moving to the left in the n-region. This represents current flow from the left to the right. Under these conditions the device acts as a p-n junction semiconductor diode.

Next consider a reversed configuration wherein a positive voltage is applied from the right hand side (from the n-doped region) to the left hand side (to the p-doped region). Under these circumstances, electrons in the n-region flow to the right and holes in the p-region flow to the left. That is, the electrons and holes move to opposite sides of the diode. Generally very little time and very little current are needed to provide this separation, which essentially stops flow of current through the diode. Under these conditions the device acts as a p-n junction reverse biased semiconductor diode. Such a device maybe used as a current blocking structure are embodiment of the present invention.

Referring back to the current blocks structure 412 of FIG. 4, the n-doped region 435 embedded in the p-doped region 437 acts as a p-n junction reverse biased semiconductor diode. The reverse biased semiconductor diode suppresses flow of electrical current from the positive voltage line 405 into the substrate 445. This electrically decouples the substrate from the line 405 and thereby suppresses flow of current and undesired electrical interactions and loads.

The n-doped region is a region of semiconductor doped with an n-type dopant. The n-type dopant may be a high-valency dopant, an electron-contributing dopant, a dopant atom providing a weakly-bound electron, an atom from group 5A of the periodic table of the elements, phosphorous, arsenic, or others. The n-type dopant may essentially add free and available electrons to the n-region.

According to one embodiment of the present invention, the n-doped region may have a dopant penetration depth and a dopant concentration level substantially similar to, or the same as, those conventionally used in a source and drain of a transistor. For example, the depth may be between about 0.1 micrometers (1 micrometer equals $1.0 \times 10^{-6}$ meters) and about 20 micrometers or between about 1 micrometer and about 10 micrometers. Likewise, the concentration level may be between about $10^{10}$ atoms/cm$^2$ and about $10^{18}$ atoms/cm$^2$ or between about $10^{13}$ atoms/cm$^2$ and about $10^{15}$ atoms/cm$^2$. Advantageously, using conventional characteristics including depth and concentration may allow the region to be fabricated during the transistor fabrication phases of integrated circuit fabrication without changing the process or settings.

The n-doped region may be created by adding n-type dopant to the semiconductor substrate. This may be done by ion implantation, by diffusion from a gaseous source in a furnace, and other methods. Ion implantation may be performed with a system that projects or fires n-type dopant atoms into the semiconductor substrate. Penetration depth may be adjusted by adjusting an implant energy, measured in keV (kilo electron volts, 1 eV equals $1.6 \times 10^{-19}$ J), which often ranges between about 10 keV and about 100 keV. Similarly, dopant concentration may be adjusted by adjusting the ion-beam current, which is essentially a representation of the number of dopant ions added.

The p-doped region sits subjacent to the n-doped region and surrounds the n-doped region. The p-region is a region doped with a p-type dopant. The p-type dopant may be a low-valency dopant, an electron deficient dopant, an atom from group 3A of the periodic table of the elements, boron, aluminum, or others. The p-type dopant may essentially add holes to the p-region.

Different embodiments of the reverse biased diode are contemplated. According to a first embodiment of the present invention, the reverse biased diode comprises another p-n junction reverse biased semiconductor diode wherein the n-doped region 435 is replaced with a p-doped region and the p-doped region 437 is replaced with an n-doped region. Such a diode may be reverse biased when the cooling structure is connected to a negative biased line or ground line (i.e., when the substrate has positive vcc and negative vss lines). In such configuration the p-doped region is connected with a negative voltage so that it forms a reverse-biased diode with the n-doped region and blocks current flow from the electrically conductive line into the substrate. According to a second embodiment of the present invention, the reverse biased diode may comprise a Schottky metal-semiconductor junction diode in reverse biased configuration relative to the voltage configuration of the semiconductor substrate so that no significant electrical current is transferred from the line to the semiconductor substrate.

FIG. 6 illustrates a microprocessor 600, one exemplary integrated circuit, containing a thermally coupling electrically decoupling cooling device 620 that contains a thermally conductive stack structure 621 of lined vias and lined conductive lines, and a current blocking reverse biased semiconductor diode structure 670 containing an n-doped region within a p-doped region, according to one embodiment of the present invention. The cooling device conducts heat away from an electrically conductive line 610 and into a substrate 680 while at the same time blocking electrical current that is carried on the line from flowing into the substrate.

The microprocessor includes a passivation layer 605 on top of a multi-layer interconnect structure comprising a dielectric 645 having embedded therein the self-heating conductive line 610, a thermally conductive structure 621 coupled with the first line, a second electrically conductive line 690, and a tortuous electrical interconnect structure 693 coupled with the second line 690. The microprocessor also includes a current blocking structure 670, coupled with the thermally conductive structure 621, and a substrate 680 containing an active transistor 699 coupled with the connection 693. The microprocessor further includes a Therma-Fin™ heat sink 685 coupled with the substrate. The Therma-Fin™ heat sink is available from Thermacore of Lancaster, Pennsylvania and utilizes folded fin technology to achieve high surface area and a fan to increasing the flow of heat from the processor and the fins to the air The thermally conductive structure 621 includes a stack of vias and lines that traverse multiple layers of dielectric material disposed between the line 612 and the substrate. The structure includes a first via 625, a first line 630, an optional thermally conductive structure 640, a second line 650, and a contact via 660. Each of these substructures may reside in different layers.

The first via 625 has a top surface in thermal contact with a liner 614 of the line 610 to receive heat from the line 610 by thermal conduction. The first via contains a liner 629 formed around its sides and bottom and disposed between via core 627 and the dielectric 645 to separate the core from the dielectric to prevent undesirable interactions between the core material and the dielectric. The core may comprise a thermally conductive metal such as copper and the liner may comprise a thinly formed or deposited layer of titanium nitride to protect against electromigration. The liner 629 has a bottom surface in thermal contact with a liner 632 of the line 630 to provide heat to the line 630 by thermal conduction. The line 630 also contains a core 634 and a second liner 636. The core may comprise a thermally conductive metal such as a copper-aluminum-silicon alloy, and either or both of the liner 632 and 636 may comprise a protecting and strengthening material such as titanium to reduce electromigration and stress fracture of the core material. The liner 636 has a bottom surface in thermal contact with any optional structure 640 to provide heat to the structure by thermal conduction. The structure may contain any desired number of additional vias similar to via 625 and any desired number of additional lines similar to line 630. The structure has a bottom surface in contact with a liner 652 of line 650. Line 650 has a liner 656 having a bottom surface in thermal contact with contact via 660 to provide heat by thermal conduction. The contact via contains two adjacent core plugs 662A and 662B, each smaller than the via 625 and having respective liners 664A and 664B on their sides and bottom. A contact 668 is thermally coupled with a bottom surface of the liners 664A-B. The cores may contain a thermally conductive metal such as tungsten. The liners may contain a material such as titanium to improve adhesion between the coremetal and the dielectric. Dielectric surrounds and separates the liners 664A-B.

The current blocking structure 670 contains an n-doped region 672 embedded within a p-doped region 674 in the near-surface region of the semiconductor substrate. The n-doped region and the p-doped region act as a reverse biased semiconductor diode relative to voltage in the line 610 and suppress or block current flow into the semiconductor substrate.

According to one embodiment of the present invention, each of the substructures of the cooling device is substantially similar to a corresponding standard integrated circuit component. For example, each substructure of the cooling device may be substantially similar to a corresponding substructure contained in the connection 693 and the transistor 699. Similarities may include using the same materials, the same height, the same fabrication process, and other similarities. For example, the n-doped region 672 may be fabricated at the same time with the same equipment, and have similar depth and concentration as an n-doped region of the transistor 699. Likewise, the contact via 660 may be formed of similar materials, height, and footprint area as another contact via 698. Of course, the sizes of the cooling device substructures may be modified. For example, via 627 may have a different size than via 694.

FIG. 7 illustrates an integrated circuit 700 having a thermally coupling electrically decoupling cooling device 710 that contains a thermally conductive stack structure 711 containing vias and lines, and a current blocking structure 735 containing a capacitor formed by an electrically insulating dielectric layer, according to one embodiment of the present invention. The cooling device conducts heat away from an electrically conductive line 705 and into a substrate 745 while the capacitor blocks flow of electrical current into the substrate.

The cooling device 710 contains a thermally conductive structure 711 and a current blocking structure 735. The thermally conductive structure 711 maybe similar to other thermally conductive structures described herein.

The current blocking structure 735 is functionally disposed between the thermally conductive structure 711 and the substrate 745. In particular, the structure is embedded within the dielectric 755 near a top surface of the substrate.

The structure 735 contains a gate contact 736 superjacent to a gate dielectric 737 that sufficiently blocks flow of current into the substrate while allowing thermal conduction of an effective amount of heat to the substrate. The structure may be an incomplete and electrically inoperative portion of a Metal Oxide Semiconductor (MOS) transistor that contains a gate contact and a gate oxide.

The gate contact 736 has a top surface in thermal contact with the contact via 730 and a bottom surface in contact with a top surface of the gate dielectric 737. The gate contact may desirably be a thermally conductive material and need not be an electrically conductive material, although it often may be. For example, the gate contact may contain a metal, polysilicon, or a silicide. The polysilicon may be n-doped polysilicon (e.g., may contain arsenic or phosphorous) or p-doped polysilicon (e.g., may contain boron).

The gate dielectric layer 737 has a top surface in contact with the gate contact and a bottom surface in contact with the semiconductor substrate. The dielectric layer may contain a layer of an oxide of the semiconductor, such as amorphous silicon dioxide, which is sandwiched between the substrate and the gate contact. The thickness may be between about 1 nanometer (one billionth of a meter) and about 100 nanometers or may be between about 5 nanometers and about 10 nanometers. The gate oxide may have similar characteristics to a gate oxide used in a conventional MOS transistor.

Figure 8:
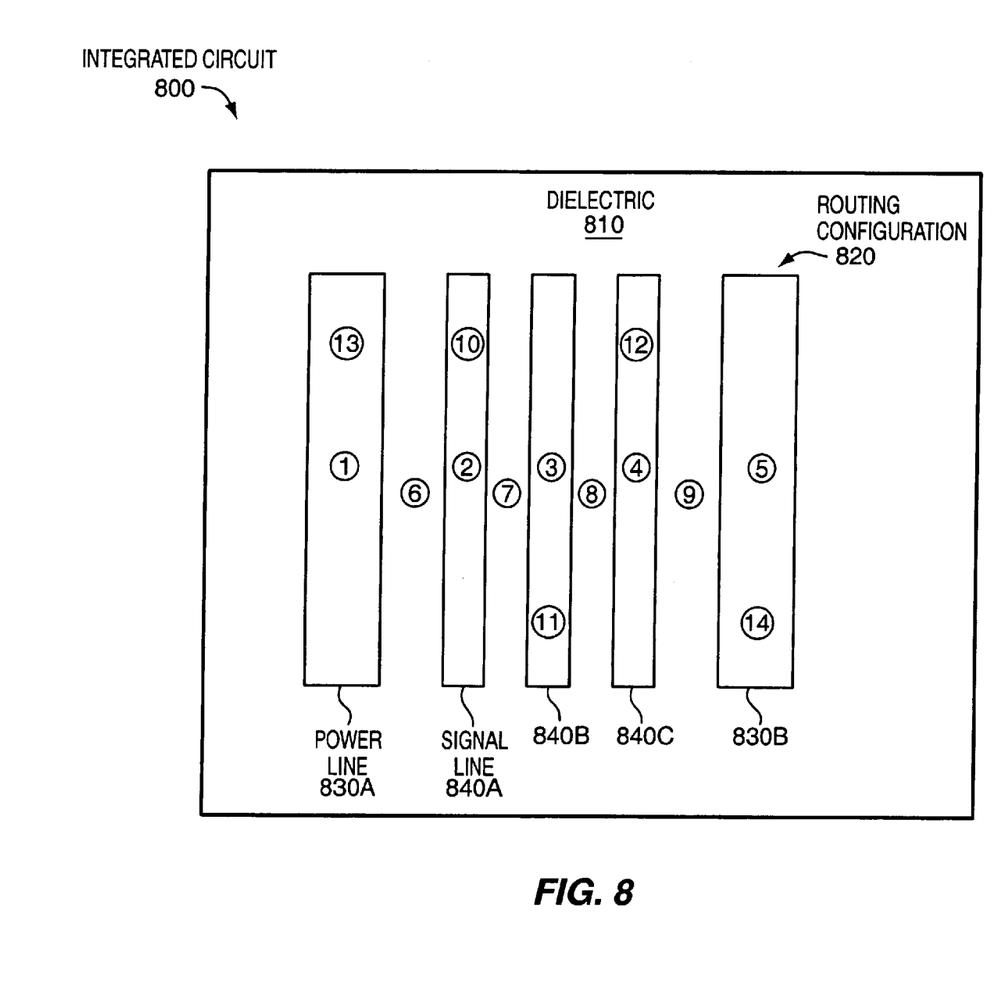
FIG. 8 shows an integrated circuit containing a dielectric material having an exemplary routing configuration of power lines and signal lines, superimposed on the configuration are positions contemplated for locating thermally coupling electrically decoupling cooling devices, as indicated by the encircled numbers, according to various embodiments of the present invention.

FIG. 8 illustrates an integrated circuit 800 containing a dielectric material 810 having routed therein an exemplary configuration 820 of electrically conductive power lines 830A and 830B and electrically conductive signal lines 840A, 840B, and 840C. As shown, the signal lines are routed between power the lines. Other routing configurations are contemplated. Encircled numbers are used to indicate positions that are contemplated to be useful for locating cooling devices that cool the power lines and signal lines, according to various embodiments of the present invention.

Both the power lines and the signal lines may self-heat as a result of current that is passed through them. Typically power lines are designed to reduce resistive current drops by designing the power lines wider than signal lines so that they have larger cross sections and carry less current per unit width. The signal lines may self-heat to a greater extent partly because they have smaller cross-sections and partly due to the high-frequency alternating current, high-slope, spiky signals they carry. The higher root mean square (RMS) current per width may cause more self-heating. This may lead to temperature increases within the lines and in sufficiently proximate regions of dielectric surrounding the lines. The power lines, the signal lines, or both the power lines and the signal lines may be cooled by providing one or more cooling devices, such as those described herein, at positions identified by the encircled numbers. Certain of these positions and certain combinations of positions will be discussed briefly below.

According to a first embodiment of the present invention, as indicated by the encircled "1", the cooling device may directly contact and thermally couple with the power line 830A. Placing the cooling device on a power line may be preferred to placing the cooling device on a signal line because the power line may carry a large and substantially invariant current and voltage that are likely to be comparatively more robust and stable relative to small loads and disturbances introduced by the presence of the cooling device. Often, the cooling device connected to the power line may have a footprint area that is between about 0.5 $\mu m^2$ (micrometers squared) and about 1.0 $\mu m^2$ and may provide a cooling flux between about $5.0 \times 10^{-4}$ Watts/$\mu m^2$ and about $20.0 \times 10^{-4}$ Watts/$\mu m^2$. One exemplary cooling device, based on a current blocking structure containing a gate dielectric layer as a capacitor, may have a footprint area of about 0.7 $\mu m^2$ and provide a flux of about $13.0 \times 10^{-4}$ Watts/$\mu m^2$. The capacitor may contribute decoupling capacitance that may be beneficial to dampen voltage spikes or fluctuations on the power line. Alternatively, a cooling device incorporating a reverse-biased diode current blocking structure may be used. Such a cooling device may have a footprint area of about 0.7 $\mu m2$ and provide a cooling flux of about $8.0 \times 10^{-4}$ Watts/$\mu m^2$.

According to a second embodiment of the present invention, as indicated by the encircled "2", the cooling device may directly contact and thermally couple with the signal line 840A. This may provide the advantage of direct cooling of the signal line, which as discussed above may experience comparatively more self-heating than the power line. Often, since signal lines are smaller than power lines, the cooling device connected to the signal line has a slightly smaller footprint area than a cooling device connected to the power line. The smaller area may provide a slightly smaller cooling flux. The footprint is often between about 0.01 $\mu m^2$ and about 0.25 $\mu m^2$ and the cooling flux is often between about $1 \times 10^{-4}$ Watts/$\mu m^2$ and about $10 \times 10^{-4}$ Watts/$\mu m^2$. One exemplary cooling device for a signal line has a footprint area of about 0.1 $\mu m^2$ and provides a cooling flux of about $6.0 \times 10^{-4}$ Watts/$\mu m^2$. One drawback to connecting the cooling device directly to the signal line is an additional typically small electrical load placed on the signal line by the cooling device that may degrade performance. Even though the loads are typically small, the signal lines are designed very accurately for precise signal timing and any additional load may distort these times and lead to degraded performance. Of course, it may be possible to accurately estimate such loads and design the signal lines taking such loads into consideration.

According to a third embodiment, as indicated by the encircled "6", a cooling device may be placed between lines, without direct contact to a line, to receive heat from dielectric 810. Although this approach may reduce the amount of heat that is removed from the lines it may also serve to further electrically decouple the lines from the semiconductor substrate by blocking or suppressing current flow into the semiconductor substrate.

According to a fourth embodiment, as indicated by the encircled "1" and "3", cooling devices may be placed on multiple lines including on both a signal line and a power line. According to a fifth embodiment, as indicated by the encircled "1" and "13", multiple cooling devices may be placed on the same line separated by a predetermined effective distance. According to a sixth embodiment, as indicated by the encircled "1", "10", "11", "12", and "5", cooling devices may be staggered along multiple adjacent lines to cool an area. Other embodiments are contemplated.

Figure 9:
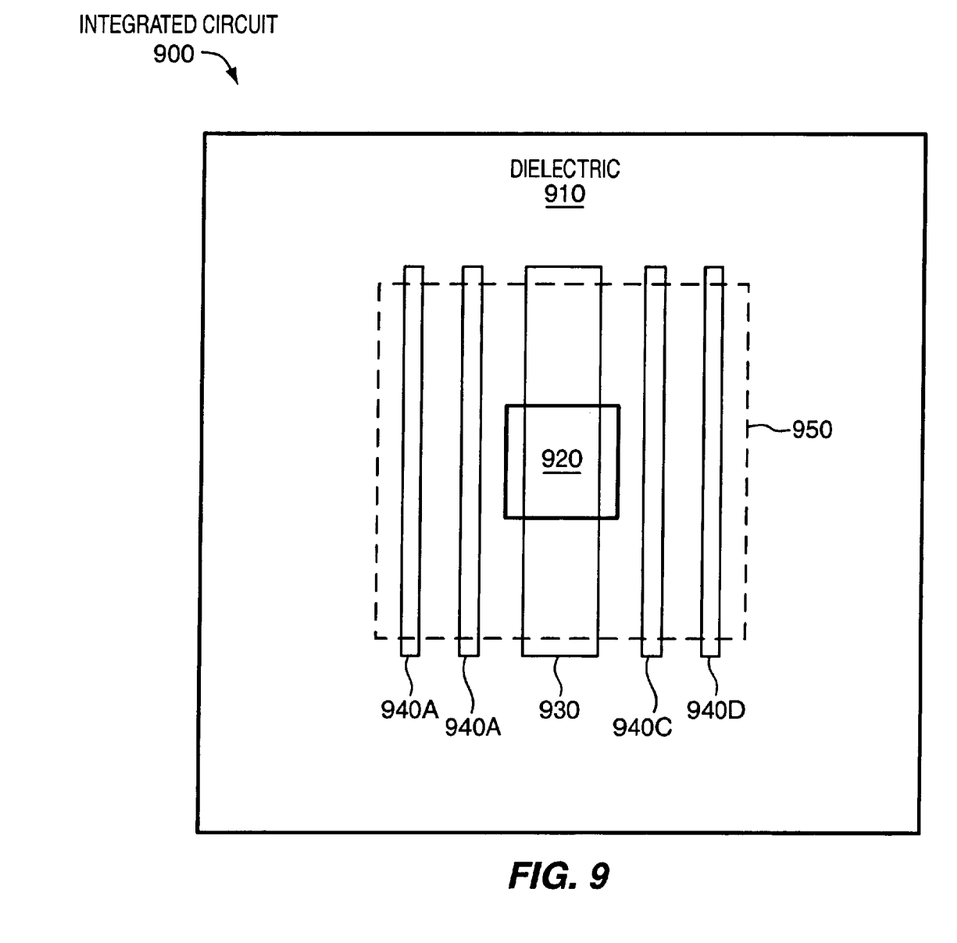
FIG. 9 shows an integrated circuit containing a plurality of signal lines, a power line, and a cooling device thermally coupled with the power line to cool the power line as well as a larger thermal influence area that includes portions of the signal lines and electrically decoupled from the substrate to block flow of electrical current from the power line into the substrate, according to one embodiment of the present invention.

FIG. 9 illustrates an integrated circuit 900 containing a dielectric material 910 having a cooling device 920 attached directly to a power line 930 that runs adjacent to a plurality of signal lines 940A, 940B, 940C, and 940D. As shown, one pair of signal lines are routed parallel to the power line at a left-hand side and another pair of signal lines are routed parallel to the power line at a right-hand side.

The power line and the signal lines carry electrical current, generate heat due to electrical resistance, self-heat, increase in temperature, and increase the temperature of the dielectric material in the vicinity of the lines. The cooling device, which is thermally coupled with both the power line and a semiconductor substrate begins to thermally conduct heat away from the power line when the temperature in the power line increases above that in the semiconductor substrate. Such cooling may decrease the temperature of a substantial length of the power line due to good thermal conductively within the line. For example, it may cool a length of about 60 micrometers. Heat may also flow from the signal lines and the dielectric material into the power line and be conducted away from the power line by the cooling device. As a result, in addition to cooling the power line, the cooling device may cool a larger thermal influence area 950, such as a square area sized about 20 micrometers (one millionth of a meter) by about 20 micrometers. The cooling device may be effective in cooling an even greater length along the power line and the signal lines due to their high thermal conductivity.

Exemplary Computer Architecture

Integrated circuits containing thermally coupling electrically decoupling cooling devices may be used in a number of electrical systems including but not limited to computer systems. For example, a computer system may comprise a microprocessor to execute instructions, the microprocessor containing a cooling device according to an embodiment of the present invention. The cooling device may cool a line within the microprocessor and thereby improve microprocessor reliability and performance. As will be appreciated by a person having an ordinary level of skill in the art and the benefit of the present disclosure, the computer system may include other conventional components such as a bus to communicate information, a memory to store information, a display device to display information, a data input device to input information, and a communication device to transmit information.

In conclusion, the present invention provides a thermally coupling electrically decoupling cooling device to cool a self-heating electrically conductive line by transferring heat from the line to a substrate while blocking flow of current from the line to the substrate, and provides an integrated circuit containing the cooling device.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A microprocessor comprising:
a semiconductor substrate containing a transistor;
an electrically conductive line to carry an electrical current associated with the transistor, the line containing an electrically conductive material that has an electrical resistance to convert a portion of the electrical current into heat; and
a thermally coupling electrically decoupling cooling device disposed between the electrically conductive line and the semiconductor substrate, the cooling device containing:
a thermally conductive structure attached to the electrically conductive line to receive the heat from the electrically conductive line and conduct the heat away from the electrically conductive line by thermal conduction, wherein the thermally conductive structure contains a thermally conductive material having a thermal conductivity greater than that of silicon dioxide, wherein the thermally conductive structure contains at least one via attached to the electrically conductive line and at least a second electrically conductive line attached to the via; and
a current blocking structure attached between the thermally conductive structure and the semiconductor substrate to receive the heat from the thermally conductive structure and conduct the heat to the semiconductor substrate by thermal conduction, wherein the current blocking structure contains an electrically insulating dielectric layer to block flow of the electrical current carried by the electrically conductive line into the semiconductor substrate, wherein the electrically insulating dielectric layer has a thickness that is between 1–100 nanometers.

2. The microprocessor of claim 1:
wherein the electrically insulating dielectric layer has a dielectric material and a thickness that are substantially the same as a dielectric material and a thickness of a gate dielectric of the transistor;
wherein the current blocking structure further comprises a gate contact; and
wherein the gate contact has a material and a thickness that are substantially the same as a material and a thickness of a gate contact of the transistor.

3. The microprocessor of claim 1:
wherein the electrically conductive line comprises a power line;
wherein the cooling device has a footprint area that is between 0.5–1.0 square micrometers; and wherein the cooling device provides a cooling flux between the electrically conductive line and the substrate that is between 0.0005 and 0.002 Watts per square micrometer.

4. The microprocessor of claim 1:

further comprising a plurality of other cooling devices coupled with the electrically conductive line; and wherein the plurality of other cooling devices are separated from the cooling device by a same predetermined distance.

5. The microprocessor of claim 1:

further comprising a computer system having the microprocessor implemented therein; and wherein the computer system contains a communication device and a display device.

6. A microelectronic device comprising:

an electrically conductive line to carry an electrical current, the line containing an electrically conductive material having an electrical resistance to convert a portion of the electrical current into heat;

a heat sink to receive at least a portion of the heat; and a cooling device thermally coupled between the conductive line and the heat sink to transfer said at least a portion of the heat from the electrically conductive line to the heat sink and electrically decoupled from the heat sink to block transfer of the electrical current into the heat sink.

7. The microelectronic device of claim 6, wherein the cooling device comprises a thermally conductive structure and a current blocking structure.

8. The microelectronic device of claim 7:

wherein the thermally conductive structure is coupled with the electrically conductive line; and wherein the current blocking structure is coupled between the thermally conductive structure and the heat sink.

9. The microelectronic device of claim 8:

wherein the thermally conductive structure comprises a thermally conductive stack structure containing a plurality of vias and a plurality of lines that are coupled between the electrically conductive line and the current blocking structure; and wherein the current blocking structure contains a capacitor.

10. The microelectronic device of claim 8:

wherein the current blocking structure comprises a gate contact and a gate oxide;

wherein the gate contact has a material and a thickness that are the same as a material and a thickness of a gate contact of a transistor of the microelectronic device; and wherein the gate oxide has a material and a thickness that are the same as a material and a thickness of a gate oxide of the transistor.

11. The microelectronic device of claim 9, wherein the capacitor contains an electrically insulating dielectric layer disposed between the thermally conductive stack structure and the heat sink.

12. The microelectronic device of claim 11:

wherein the electrically insulating dielectric layer has a thickness that is between 1–100 nanometers; and wherein the electrically insulating dielectric layer contains a material that is selected from the group consisting of silicon dioxide and a material having a lower dielectric constant than silicon dioxide.

13. The microelectronic device of claim 11, wherein the electrically insulating dielectric layer has a dielectric material and thickness that are the same as a gate dielectric of a transistor of the microelectronic device.

14. The microelectronic device of claim 6, wherein the electrically conductive line comprises a power line.

15. The microelectronic device of claim 14:

wherein the cooling device has a footprint area that is between 0.5–1.0 square micrometers; and wherein the cooling device provides a cooling flux between the electrically conductive line and the heat sink that is between 0.0005 and 0.002 Watts per square micrometer.

16. The microelectronic device of claim 6, wherein the electrically conductive line comprises a signal line.

17. The microelectronic device of claim 16:

wherein the cooling device has a footprint area that is between 0.01–0.25 square micrometers; and wherein the cooling device provides a cooling flux between the electrically conductive line and the heat sink that is between 0.0001–0.001 Watts per square micrometer.

18. The microelectronic device of claim 6:

further comprising a plurality of other cooling devices coupled with the electrically conductive line; and wherein the plurality of other cooling devices are separated from the cooling device by a same predetermined distance.

19. The microelectronic device of claim 6:

further comprising a computer system containing the microelectronic device implemented therein as a microprocessor;

wherein the computer system comprises a communication device and a display device; and wherein the electrically conductive line comprises a power line.

20. An integrated circuit comprising:

a semiconductor substrate containing a semiconductor device;

an electrically conductive line to carry an electrical current associated with the semiconductor device, the line containing an electrically conductive material having an electrical resistance to convert a portion of the electrical current into heat; and a cooling device thermally coupled between the electrically conductive line and the semiconductor substrate to transfer heat from the electrically conductive line to the semiconductor substrate and electrically decoupled from the semiconductor substrate to suppress flow of the electrical current into the semiconductor substrate.

21. The integrated circuit of claim 20:

wherein the cooling device comprises a thermally conductive structure coupled with the electrically conductive line and a current blocking structure coupled between the thermally conductive structure and the substrate;

wherein the thermally conductive structure comprises a thermally conductive stack structure containing a plurality of vias and a plurality of lines that are coupled between the electrically conductive line and the current blocking structure;

wherein the current blocking structure comprises a capacitor;

wherein the capacitor contains an electrically insulating dielectric layer disposed between the thermally conductive stack structure and the substrate; and wherein the electrically insulating dielectric layer has a thickness that is between 1–100 nanometers.

22. The integrated circuit of claim 21, wherein the current blocking structure is embedded within a dielectric near a top surface of the substrate.

23. The integrated circuit of claim 21, wherein the electrically insulating dielectric layer has a dielectric material and a thickness that are the same as a dielectric material and a thickness of a gate dielectric of a transistor of the integrated circuit.

24. The integrated circuit of claim 21:
   wherein the electrically conductive line comprises a power line;
   wherein the cooling device has a footprint area that is between 0.5–1.0 square micrometers; and
   wherein the cooling device provides a cooling flux between the electrically conductive line and the substrate that is between 0.0005 and 0.002 Watts per square micrometer.

25. The integrated circuit of claim 21:
   wherein the electrically conductive line comprises a signal line;
   wherein the cooling device has a footprint area that is between 0.01–0.25 square micrometers; and
   wherein the cooling device provides a cooling flux between the electrically conductive line and the substrate that is between 0.0001–0.001 Watts per square micrometer.

26. The integrated circuit of claim 21:
   further comprising a plurality of other cooling devices coupled with the electrically conductive line; and
   wherein the plurality of other cooling devices are separated from the cooling device by a same predetermined distance.

27. The integrated circuit of claim 21:
   further comprising a computer system having the integrated circuit implemented as a microprocessor therein;
   wherein the computer system comprises a display device and a communication device; and
   wherein the electrically conductive line comprises a power line.

28. The integrated circuit of claim 20:
   wherein the cooling device comprises a thermally conductive structure coupled with the electrically conductive line and a current blocking structure coupled between the thermally conductive structure and the substrate;
   wherein the current blocking structure comprises a gate contact and a gate oxide;
   wherein the gate contact has a material and a thickness that are the same as a material and a thickness of a gate contact of a transistor of the integrated circuit; and
   wherein the gate oxide has a material and a thickness that are the same as a material and a thickness of a gate oxide of the transistor.

29. A cooling device comprising:
   a thermally conductive structure thermally coupled with a self-heating electrically conductive line to receive heat generated by the electrically conductive line and containing a thermally conductive material to conduct the received heat away from the electrically conductive line; and
   a current blocking structure thermally coupled with the thermally conductive structure to receive heat from the thermally conductive structure, the current blocking structure containing an at least partially thermally conductive material to conduct the heat received from the thermally conductive structure to a heat sink, the current blocking structure containing a device to block flow of electrical current from the electrically conductive line into the heat sink.

30. The cooling device of claim 29:
   wherein the thermally conductive material comprises a thermally conductive stack structure containing a plurality of vias and a plurality of lines that are coupled between the electrically conductive line and the current blocking structure; and
   wherein the device to block flow of electrical current from the electrically conductive line into the heat sink comprises a capacitor.

31. The cooling device of claim 30, wherein the capacitor contains an electrically insulating dielectric layer disposed between the thermally conductive stack structure and the heat sink.

32. The cooling device of claim 31:
   wherein the electrically insulating dielectric layer has a thickness that is between 1–100 nanometers; and
   wherein the electrically insulating dielectric layer comprises a material that is selected from the group consisting of silicon dioxide and a material having a dielectric constant that is lower than that of silicon dioxide.

33. The cooling device of claim 31, wherein the electrically insulating dielectric layer has a dielectric material and thickness that are the same as a gate dielectric of a transistor of the integrated circuit.

34. The cooling device of claim 29:
   wherein the current blocking structure comprises a gate contact and a gate oxide;
   wherein the gate contact has a material and a thickness that are the same as a material and a thickness of a gate contact of a transistor of the integrated circuit; and
   wherein the gate oxide has a material and a thickness that are the same as a material and a thickness of a gate oxide of the transistor.

35. The cooling device of claim 29:
   wherein the electrically conductive line comprises a power line;
   wherein the cooling device has a footprint area that is between 0.5–1.0 square micrometers; and
   wherein the cooling device provides a cooling flux between the electrically conductive line and the heat sink that is between 0.0005 and 0.002 Watts per square micrometer.

36. The cooling device of claim 29:
   wherein the electrically conductive line comprises a signal line;
   wherein the cooling device has a footprint area that is between 0.01–0.25 square micrometers; and
   wherein the cooling device provides a cooling flux between the electrically conductive line and the heat sink that is between 0.0001–0.001 Watts per square micrometer.

37. A computer system comprising:
   a memory;
   a bus coupled to the memory;
   a microprocessor coupled to the bus containing:
      an electrically conductive line to carry an electrical current, the line containing an electrically conductive material having an electrical resistance to convert a portion of the electrical current into heat;
      a heat sink to receive at least a portion of the heat; and
      a cooling device thermally coupled between the conductive line and the heat sink to transfer said at least a portion of the heat from the electrically conductive line to the heat sink and electrically decoupled from the heat sink to block transfer of the electrical current into the heat sink; and a communication device coupled with the bus.

38. The computer system of claim 37:

wherein the electrically conductive line comprises a power line;

wherein the cooling device has a footprint area that is between 0.5–1.0 square micrometers; and wherein the cooling device provides a cooling flux between the electrically conductive line and the heat sink that is between 0.0005 and 0.002 Watts per square micrometer.

39. The computer system of claim 37:

wherein the electrically conductive line comprises a signal line;

wherein the cooling device has a footprint area that is between 0.01–0.25 square micrometers; and wherein the cooling device provides a cooling flux between the electrically conductive line and the heat sink that is between 0.0001–0.001 Watts per square micrometer.

40. The computer system of claim 37, wherein the cooling device comprises a thermally conductive structure coupled with the electrically conductive line and a current blocking structure coupled between the thermally conductive structure and the heat sink.

41. The computer system of claim 40:

wherein the current blocking structure comprises a gate contact and a gate oxide;

wherein the gate contact has a material and a thickness that are the same as a material and a thickness of a gate contact of a transistor of the microprocessor: and wherein the gate oxide has a material and a thickness that are the same as a material and a thickness of a gate oxide of the transistor.

42. The computer system of claim 40:

wherein the thermally conductive structure comprises a thermally conductive stack structure containing a plurality of vias and a plurality of lines that are coupled between the electrically conductive line and the current blocking structure; and wherein the current blocking structure contains a capacitor.

43. The computer system of claim 42, wherein the capacitor contains an electrically insulating dielectric layer disposed between the thermally conductive stack structure and the heat sink.

44. The computer system of claim 43, wherein the electrically insulating dielectric layer has a dielectric material and thickness that are the same as a gate dielectric of a transistor of the microprocessor.

45. A computer system comprising:

a memory;

a bus coupled to the memory;

a microprocessor coupled to the bus containing:

a semiconductor substrate containing a semiconductor device;

an electrically conductive line to carry an electrical current associated with the semiconductor device, the line containing an electrically conductive material having an electrical resistance to convert a portion of the electrical current into heat; and a cooling device thermally coupled between the electrically conductive line and the semiconductor substrate to transfer heat from the electrically conductive line to the semiconductor substrate and electrically decoupled from the semiconductor substrate to suppress flow of the electrical current into the semiconductor substrate; and a communication device coupled with the bus.

46. The computer system of claim 45:

wherein the cooling device comprises a thermally conductive structure coupled with the electrically conductive line and a current blocking structure coupled between the thermally conductive structure and the substrate;

wherein the current blocking structure comprises a gate contact and a gate oxide;

wherein the gate contact has a material and a thickness that are the same as a material and a thickness of a gate contact of a transistor of the integrated circuit: and wherein the gate oxide has a material and a thickness that are the same as a material and a thickness of a gate oxide of the transistor.

47. The computer system of claim 45:

wherein the electrically conductive line comprises a power line;

wherein the cooling device has a footprint area that is between 0.5–1.0 square micrometers; and wherein the cooling device provides a cooling flux between the electrically conductive line and the substrate that is between 0.0005 and 0.002 Watts per square micrometer.

48. The computer system of claim 45:

wherein the electrically conductive line comprises a signal line;

wherein the cooling device has a footprint area that is between 0.01–0.25 square micrometers; and wherein the cooling device provides a cooling flux between the electrically conductive line and the substrate that is between 0.0001–0.001 Watts per square micrometer.

49. The computer system of claim 45:

wherein the cooling device comprises a thermally conductive structure coupled with the electrically conductive line and a current blocking structure coupled between the thermally conductive structure and the substrate;

wherein the thermally conductive structure comprises a thermally conductive stack structure containing a plurality of vias and a plurality of lines that are coupled between the electrically conductive line and the current blocking structure;

wherein the current blocking structure comprises a capacitor;

wherein the capacitor contains an electrically insulating dielectric layer disposed between the thermally conductive stack structure and the substrate; and wherein the electrically insulating dielectric layer has a thickness that is between 1–100 nanometers.

50. The computer system of claim 49, wherein the electrically insulating dielectric layer has a dielectric material and a thickness that are the same as a dielectric material and a thickness of a gate dielectric of a transistor of the microprocessor.

* * * * *